United States Patent
Tanaka

Patent Number: 5,834,704
Date of Patent: Nov. 10, 1998

[54] PATTERN STRUCTURE OF FLEXIBLE PRINTED CIRCUIT BOARD

[75] Inventor: Kazuhisa Tanaka, Omiya, Japan

[73] Assignee: Fuji Photo Optical Company, Limited, Saitama, Japan

[21] Appl. No.: 855,557

[22] Filed: Jun. 4, 1997

[30] Foreign Application Priority Data

Sep. 4, 1996 [JP] Japan .................................. 8-233945

[51] Int. Cl.⁶ ............................................ H05K 1/00
[52] U.S. Cl. .......................... 174/254; 428/901; 361/749
[58] Field of Search ........................ 439/67, 77; 174/254, 174/268, 250, 117 F, 117 FF; 361/749; 396/542; 428/209, 901

[56] References Cited

U.S. PATENT DOCUMENTS

| | | | |
|---|---|---|---|
| 3,702,025 | 11/1972 | Archer | 438/6 |
| 4,902,646 | 2/1990 | Nakano | 438/577 |
| 5,032,890 | 7/1991 | Ushiku et al. | 257/211 |
| 5,182,235 | 1/1993 | Eguchi | 438/618 |
| 5,204,806 | 4/1993 | Sasaki et al. | 361/749 |
| 5,308,682 | 5/1994 | Morikawa | 428/195 |
| 5,357,140 | 10/1994 | Kozasa | 257/752 |
| 5,541,814 | 7/1996 | Janai et al. | 361/778 |
| 5,652,465 | 7/1997 | Hosoda et al. | 257/758 |

*Primary Examiner*—Bot L. Ledynh
*Assistant Examiner*—Kristina Soderquist
*Attorney, Agent, or Firm*—Oliff & Berridge, PLC

[57] ABSTRACT

In a pattern structure of a flexible print circuit board, a plurality of electric signal transmitting patterns are formed as thin as possible as well as one of at least two void patterns is formed between the electric signal transmitting patterns and cut portions are formed to the respective void patterns so that they are directed in the bending direction of the flexible print circuit board. With this arrangement, the flexible print circuit board can be accurately and easily bent at a bending position without the need of a metal mold and special index patterns.

2 Claims, 3 Drawing Sheets

PRIOR ART

PRIOR ART

PATTERN STRUCTURE OF FLEXIBLE PRINTED CIRCUIT BOARD

BACKGROUND OF THE INVENTION

1. Field of the Invention

The present invention relates to a pattern structure of a flexible print circuit board, and more specifically, to a pattern structure which is most suitable when the flexible print circuit board is bent.

2. Description of the Related Art

In general, when it is required to bend a flexible print circuit board at a portion where a plurality of electric signal transmitting patterns are formed in a band shape, there is employed such means that cutouts 12, 12 are formed to both the sides of a flexible print circuit board 11 to which a plurality of patterns 16, 16 . . . are formed in parallel with each other as shown in FIG. 3 or index patterns (copper foil) 13, 13 are formed to both the sides of a flexible print circuit board 11 to which a plurality of patterns 16, 16 . . . are formed in parallel with each other as shown in FIG. 4.

As shown in FIG. 3 and FIG. 4, the flexible print circuit board 11 is bent along a direction 19 between the cutouts 12, 12 or a direction 19 between the indexes 13, 13 by shifting the positions of the cutouts 12, 12 or the indexes 13, 13 on both the sides of the flexible print circuit board 11.

However, when the cutouts 12, 12 are formed to both the sides of the flexible print circuit board 11, since the outside shape of the flexible print circuit board 11 is formed using a metal die, there is a problem that when a bending position is changed, the metal mold must be modified and a cost is increased.

When the index patterns 13, 13 are formed to both the sides of the flexible print circuit board 11, no metal mold is related to the index patterns 13, 13 and the index patterns 13, 13 do not serve as a guide for bending processing when the board 11 is bent, although it serves as an index for bending. However, the flexible print circuit board 11 using the index patterns 13, 13 is inferior to those using the cutouts 12, 12 in workability.

Further, there is also a method of forming so-called guard patterns 14, 14 where no electric signal is transmitted on both the outer sides of a flexible print circuit board 11 to protect signal patterns 16, 16 . . . as shown in FIG. 5. In the method, the outside guard patterns 14, 14 are cut to secure a bending position where bending processing is carried out when the flexible print circuit board 11 is bent and a direction 19 between cut portions 15, 15 which serve as an index in the bending processing is used as a bending direction.

In the method, however, although the cut portions 15, 15 of the guard patterns 14, 14 serve as an index in the bending processing, it does not serve as a guide in the bending processing likewise the one shown in FIG. 4. Thus, the method is a little inferior in workability.

On the other hand, in the design of a pattern in a usual flexible print circuit board, the widths of patterns 16, 16 . . . are abruptly changed in the vicinity of a bending position as shown in FIG. 6 so that the flexible print circuit board can be bent in the direction 19 of the narrowed widths.

Since it is known in this case that the patterns 16, 16 . . . are liable to be cut off at the narrow-width portions 17, 17 . . . due to the stress which is caused when the flexible print circuit board is bent, it is preferable that the width of the pattern at the portion where the flexible print circuit board is bent is similar to the width of the other portion of the pattern.

An object of the present invention made to solve the problems of the conventional flexible print circuit boards as described above is to provide a pattern structure of a flexible print circuit board which permits bending processing to be easily carried out by increasing flexibility by lowering the density of a pattern at a bending position without changing the width of the pattern as well as eliminates the necessity of a special metal mold for the bending processing and does not increase a cost for the bending processing.

SUMMARY OF THE INVENTION

To achieve the above object, a pattern structure of a flexible print circuit board comprises a plurality of signal lines and at least two void patterns provided with cut portions with at least one of the void patters located between the signal lines.

Further, the cut portions of the respective void patterns are located on an approximately straight line.

Since the density of a plurality of patterns formed approximately in parallel with each other on the flexible print circuit board is lowered along the bending position thereof, the flexible print circuit board can be easily bent along the portion where the density is lowered.

DESCRIPTION OF THE PREFERRED EMBODIMENT

Figure 1:
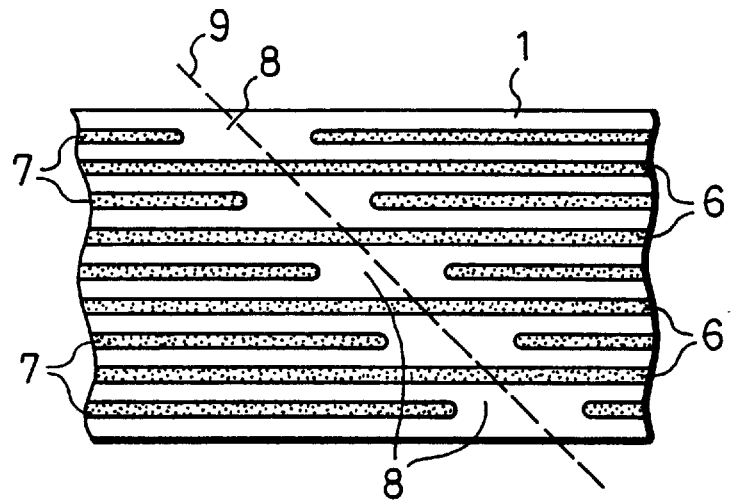
FIG. 1 is a schematic view showing an embodiment of a pattern structure of a flexible print circuit board according to the present invention.

A pattern structure of a flexible print circuit board according to the present invention shown in the drawings will be described below.

FIG. 1 shows an embodiment of the pattern structure of the flexible print circuit board according to the present invention.

In the embodiment, a plurality of electric signal transmitting patterns 6, 6, . . . are formed to a flexible print circuit board 1 approximately in parallel with each other. In this case, the electric signal transmitting patterns 6, 6, . . . are formed as thin as possible taking a pattern etching accuracy and a necessary current capacity into consideration.

Then, a plurality of so-called void patterns 7, 7 . . . which are defined as patterns which do not carry, an electric signal is formed to the thus formed vacant portions approximately in parallel with the electric signal transmitting patterns 6, 6, . . . . At least one of the plurality of void patterns 7, 7, . . . is located between the electric signal transmitting patterns 6, 6.

Further, cut portions 8, 8 . . . are formed by cutting off a portion of the plurality of void patterns 7, 7, . . . so that the cut portions 8, 8 . . . of the plurality of void patterns 7, 7, . . . serve as a bending position. Since a pattern density is lowered in a direction 9 in which the cut portions 8, 8 . . . are continuously formed, the flexible print circuit board 1 can be easily bent along the direction 9.

Therefore, in the pattern structure of the flexible print circuit board shown in FIG. 1, the flexible print circuit board can be bent obliquely.

Figure 2:
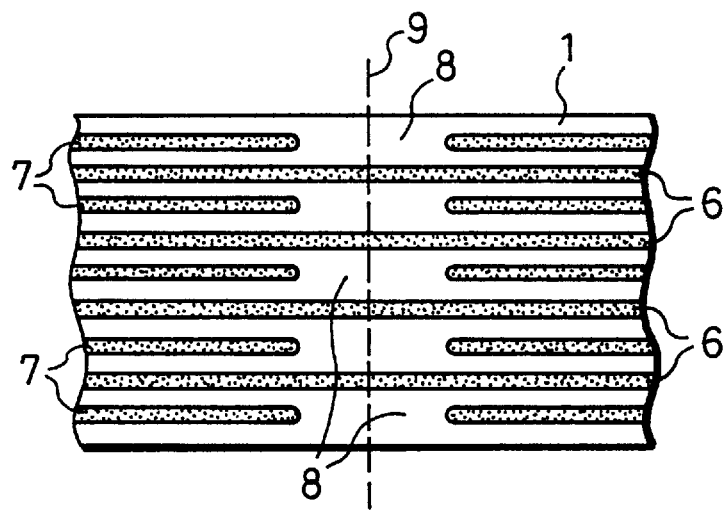
FIG. 2 is a schematic view showing another embodiment of the pattern structure of the flexible print circuit board according to the present invention.
Figure 3:
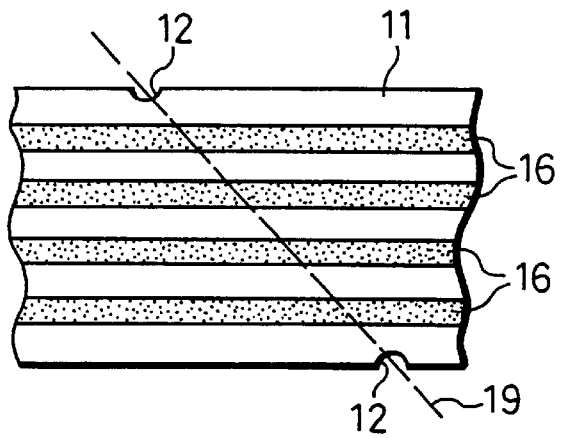
FIG. 3 is a schematic view showing a pattern structure of a conventional flexible print circuit board in which cutouts are formed to both the sides of the flexible print circuit board.
Figure 4:
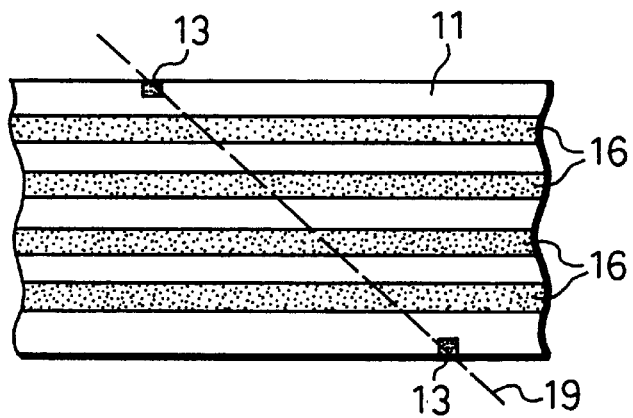
FIG. 4 is a schematic view showing a pattern structure of a conventional flexible print circuit board in which index patterns are formed to both the sides of the flexible print circuit board.
Figure 5:
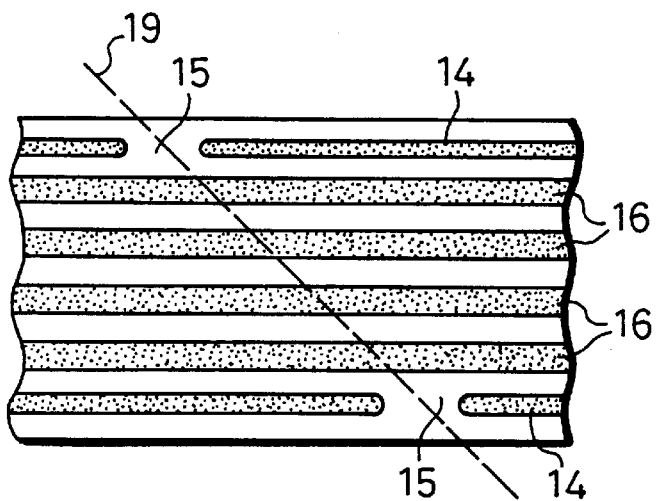
FIG. 5 is a schematic view showing a pattern structure of a conventional flexible print circuit board in which guard patterns are formed to both the sides of a plurality of signal patterns.
Figure 6:
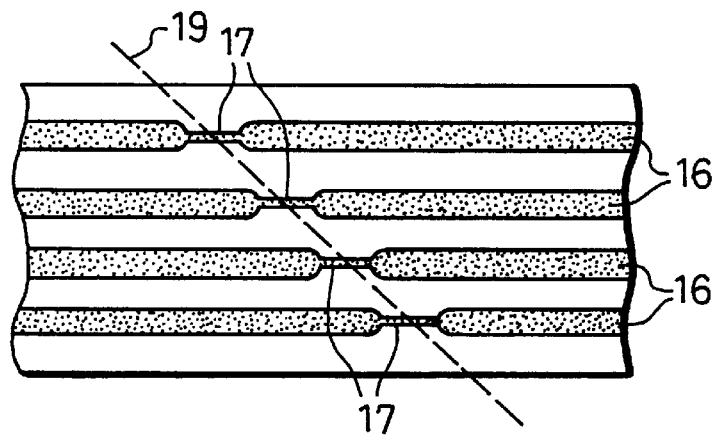
FIG. 6 is a schematic view showing a usual flexible print circuit board in which the widths of patterns are changed in the vicinity of a bending position.

FIG. 2 shows another embodiment of the pattern structure of the flexible print circuit board according to the present invention. In the embodiment, respective cut portions 8, 8 . . . formed to a plurality of void patterns 7, 7, . . . are continuously disposed in a direction 9 perpendicular to the flexible print circuit board 1.

Therefore, in the pattern structure of the flexible print circuit board shown in FIG. 2, the flexible print circuit board 1 can be bent at a right angle.

Note, although the electric signal transmitting patterns 6, 6, . . . and the void patterns 7, 7, . . . are alternately formed in the embodiments shown in FIG. 1 and FIG. 2, the present invention is not limited thereto but it suffices only that the flexible print circuit board has at least two void patterns 7, 7 provided with cut portions with at least one of the void patterns 7, 7 located between electric signal transmitting patterns 6, 6 and the position where the flexible print circuit board is bent has a pattern density which is lowered by the cut portions 8, 8 of the void patterns 7, 7.

As described above, since the present invention includes the plurality of signal lines and at least the two void patterns and at least one of the void patterns is located between the signal lines, a bending guide is formed by lowering a pattern density by the cut portions provided with the void patterns.

Therefore, since a bending guide can be formed without the need of a special processing made to a metal mold, the flexible print circuit board can be made at a low cost as well as a bending processing can be accurately and easily carried out, whereby workability is enhanced.

Since the bending processing is carried out through the cut portions formed to the void patterns, a bending position can be changed without a large cost.

Further, since the bending position of the present invention is located at the cut portions of the void patterns, it has an advantage that there is not a possibility of the occurrence of breaking of wire at all which would be caused by a flexible print circuit board bent through narrowed patterns.

What is claimed is:

1. A pattern structure of a flexible print circuit board, comprising:

a plurality of signal lines; and at least two void patterns provided with cut portions with at least one of said void patterns located between said signal lines, wherein the flexible print circuit board is capable of being bent at the cut portions of the void patterns.

2. A pattern structure of a flexible print circuit board according to claim 1, wherein the cut portions of said void patterns are located on an approximately straight line.

\* \* \* \* \*